United States Patent
Akiyama et al.

(10) Patent No.: US 10,706,985 B2
(45) Date of Patent: Jul. 7, 2020

(54) ALUMINUM FOIL, ELECTRONIC COMPONENT WIRING BOARD MANUFACTURED USING THE SAME, AND METHOD OF MANUFACTURING ALUMINUM FOIL

(71) Applicant: TOYO ALUMINIUM KABUSHIKI KAISHA, Osaka-shi, Osaka (JP)

(72) Inventors: Sotaro Akiyama, Osaka (JP); Yoshitaka Nishio, Osaka (JP)

(73) Assignee: TOYO ALUMINIUM KABUSHIKI KAISHA, Osaka-Shi, Osaka (JP)

( * ) Notice: Subject to any disclaimer, the term of this patent is extended or adjusted under 35 U.S.C. 154(b) by 926 days.

(21) Appl. No.: 15/109,760

(22) PCT Filed: May 26, 2015

(86) PCT No.: PCT/JP2015/065056
§ 371 (c)(1),
(2) Date: Jul. 5, 2016

(87) PCT Pub. No.: WO2015/182589
PCT Pub. Date: Dec. 3, 2015

(65) Prior Publication Data
US 2016/0358684 A1    Dec. 8, 2016

(30) Foreign Application Priority Data
May 30, 2014 (JP) ................. 2014-112549

(51) Int. Cl.
| H01B 1/02 | (2006.01) |
| C22C 21/00 | (2006.01) |
| C22F 1/04 | (2006.01) |
| B23K 35/02 | (2006.01) |
| B23K 35/28 | (2006.01) |
| B21B 3/00 | (2006.01) |
| B21B 1/04 | (2006.01) |
| B21B 1/40 | (2006.01) |
| H05K 1/09 | (2006.01) |

(52) U.S. Cl.
CPC ............. *H01B 1/023* (2013.01); *B21B 1/04* (2013.01); *B21B 1/40* (2013.01); *B21B 3/00* (2013.01); *B23K 35/0233* (2013.01); *B23K 35/286* (2013.01); *B23K 35/288* (2013.01); *C22C 21/003* (2013.01); *C22F 1/04* (2013.01); *B21B 2003/001* (2013.01); *H05K 1/09* (2013.01); *H05K 2201/0355* (2013.01)

(58) Field of Classification Search
CPC ....... H01B 1/023; C22C 21/00; C22C 21/003; C22F 1/04
See application file for complete search history.

(56) References Cited

U.S. PATENT DOCUMENTS

| 5,192,377 | A | 3/1993 | Prinz et al. |
| 5,518,823 | A | 5/1996 | Fujihira et al. |
| 6,491,772 | B1 * | 12/2002 | Scappaticci ............. C22C 21/00 148/437 |
| 2003/0042290 | A1 * | 3/2003 | Wagner ................. B32B 15/016 228/111.5 |
| 2007/0071994 | A1 | 3/2007 | Hayashida et al. |

FOREIGN PATENT DOCUMENTS

| CN | 1063178 A | 7/1992 |
| CN | 1336963 A | 2/2002 |
| CN | 1252308 C | 4/2006 |
| CN | 104357711 A | 2/2015 |
| JP | 60-33896 A | 2/1985 |
| JP | 2001-525488 A | 12/2001 |
| JP | 2004-521190 A | 7/2004 |
| JP | 2004-263210 A | 9/2004 |
| JP | 2009-34739 A | 2/2009 |
| JP | 2009034739 A * | 2/2009 |
| JP | 2014-50861 A | 3/2014 |
| WO | WO 2004/076724 A1 | 2/2002 |

OTHER PUBLICATIONS

Chinese Office Action dated Dec. 17, 2018 for Chinese Application No. 201711051851.9 with a partial English translation of the Chinese Office Action.
Taiwanese Office Action and Search Report, dated Jan. 26, 2018, for Taiwanese Application No. 104117512, with English translations.
Japan Aluminium Association, "Aluminum Handbook," edited by Standard General Committee, vol. 7, Jan. 31, 2007, pp. 5-8 (Total 5 pages).
The Japan Institute of Light Metals, "Aluminum Products and Technology of Manufacturing Aluminum," Oct. 31, 2001, pp. 417-418 (Total 3 pages).

* cited by examiner

*Primary Examiner* — George Wyszomierski
*Assistant Examiner* — Janell C Morillo
(74) *Attorney, Agent, or Firm* — Birch, Stewart, Kolasch & Birch, LLP

(57) ABSTRACT

An aluminum foil having a high adhesiveness to solder and containing at least one of Sn and Bi, in which a ratio of a total mass of Sn and Bi to a total mass of the aluminum foil is 0.0075 mass % or more and 15 mass % or less.

5 Claims, No Drawings

ALUMINUM FOIL, ELECTRONIC COMPONENT WIRING BOARD MANUFACTURED USING THE SAME, AND METHOD OF MANUFACTURING ALUMINUM FOIL

TECHNICAL FIELD

The present invention relates to aluminum foil, an electronic component wiring board manufactured using the same, and a method of manufacturing aluminum foil.

BACKGROUND ART

Generally, aluminum has a surface on which an oxide film is formed. Since this oxide film has low adhesiveness to solder, aluminum cannot be soldered using ordinary solder for copper. Accordingly, in the case where a base material made of aluminum is soldered, it is necessary to use special flux having high activity that is enough to allow removal of this oxide film, and also necessary to use, as a base material, aluminum having a surface plated with dissimilar metal, as disclosed in Japanese Patent Laying-Open No. 2004-263210 (PTD 1).

CITATION LIST

Patent Document

PTD 1: Japanese Patent Laying-Open No. 2004-263210

SUMMARY OF INVENTION

Technical Problem

However, in the case where special flux having high activity as described above is used, flux needs to be removed by subjecting the soldered base material to a cleaning process and the like. This is because the flux remained after soldering tends to cause aluminum to corrode. Furthermore, in the case where aluminum plated with dissimilar metal is used, aluminum needs to be subjected to a plating process in advance. Accordingly, soldering to aluminum conventionally tends to increase the number of steps and the time that are required for processing as compared with other metals such as copper and silver.

Also, it is expected to employ aluminum foil as a wiring line and the like in an electronic component. However, for example, when special and highly-active flux for aluminum as described above is used, a cleaning step needs to be performed after electronic components are mounted. Thereby, it is feared that the steps may become complicated and defects may occur in the electronic components.

The present invention has been made in light of the above-described circumstances. An object of the present invention is to provide aluminum foil having high adhesiveness also to ordinary solder for copper, an electronic component wiring board manufactured using the aluminum foil, and a method of manufacturing aluminum foil.

Solution to Problem

In order to solve the above-described problems, the present inventors have conducted earnest studies for achieving a composition of aluminum foil such that the aluminum foil itself can have high adhesiveness to solder without having to use special and highly-active flux that is developed for ordinary aluminum or having to subject the aluminum foil to a plating process.

Then, the present inventors have found that the adhesiveness of aluminum foil to solder can be improved by mixing at least one of Sn and Bi in aluminum molten metal during manufacturing of the aluminum foil. Furthermore, the present inventors have repeatedly conducted earnest studies, thereby completing the present invention.

Specifically, aluminum foil according to one embodiment of the present invention contains at least one of Sn and Bi, in which a ratio of a total mass of Sn and Bi to a total mass of the aluminum foil is 0.0075 mass % or more and 15 mass % or less.

According to the above-described aluminum foil, it is preferable that a ratio of a total surface area of Sn and Bi to a total surface area of the aluminum foil is 0.01% or more and 65% or less, and the ratio of the total surface area is 5 times or more a ratio of a total volume of Sn and Bi to a volume of Al.

Furthermore, it is preferable that the aluminum foil is tempered in a range from O to 1/4H defined in JIS-H0001.

Furthermore, the aluminum foil can be used for aluminum foil for soldering.

Furthermore, one embodiment of the present invention also relates to an electronic component wiring board manufactured using the aluminum foil.

A method of manufacturing aluminum foil according to one embodiment of the present invention includes the steps of: preparing aluminum molten metal; adding at least one of Sn and Bi to the aluminum molten metal to produce a molten metal mixture in which a ratio of a total mass of Sn and Bi is 0.0075 mass % or more and 15 mass % or less; forming an ingot or a casting plate using the molten metal mixture; rolling the ingot or the casting plate to manufacture aluminum foil in which the ratio of the total mass of Sn and Bi is 0.0075 mass % or more and 15 mass % or less, the aluminum foil being tempered in a range from 3/4H to H defined in JIS-H0001; and subjecting the tempered aluminum foil to a heat treatment at a temperature of 230° C. or more so as to be tempered.

Advantageous Effects of Invention

According to the present invention, aluminum foil having high adhesiveness also to ordinary solder for copper can be provided.

DESCRIPTION OF EMBODIMENTS

Aluminum Foil

Aluminum foil according to the present embodiment contains at least one of Sn and Bi, in which the ratio of the total mass of Sn and Bi to the total mass of the aluminum foil is 0.0075 mass % or more and 15 mass % or less.

"Aluminum" used herein includes: "pure aluminum" made of 99.0 mass % or more of Al; and an "aluminum alloy" made of less than 99.0 mass % of Al and 1.0 mass % or more of optional additional elements. The optional additional elements may be silicon (Si), iron (Fe), copper (Cu), and the like. The upper limit value of the total amount of the optional additional elements is 2.0 mass %.

Accordingly, the "aluminum foil" of the present invention includes "aluminum alloy foil", and also can be referred to as "aluminum alloy foil" from the viewpoint that it contains Sn, Bi or both of them with a content as described above.

The content (mass) of each of Sn, Bi, optional additional elements, and inevitable impurities in aluminum foil can be measured by the total reflection fluorescence X-ray (TXRF) method, the ICP emission spectrochemical analysis (ICP) method, the inductively coupled plasma mass spectrometry (ICP-MS) method, and the like.

The aluminum foil according to the present embodiment is higher in adhesiveness to solder than the conventional aluminum foil. Accordingly, during soldering, it is not necessary to use special and highly-active flux that is developed for ordinary aluminum or to subject the aluminum foil to a plating process. Therefore, highly accurate soldering can be implemented.

In addition, "solder" used in soldering of the aluminum foil according to the present embodiment is not particularly limited, but can be known solder that is generally used for copper, and may for example be: lead-containing solder containing lead (Pb) and Sn as main components; lead-free solder; and the like. From the viewpoint of environmental protection, it is preferable to use lead-free solder for soldering of the aluminum foil according to the present embodiment.

As to the aluminum foil according to the present embodiment, it is unclear why adhesiveness to solder is improved when the ratio of the total mass of Sn and Bi to the total mass of the aluminum foil is 0.0075 mass % or more and 15 mass % or less. The present inventors presume the reason as described below.

In the case where aluminum foil contains at least one of Sn and Bi, Sn, Bi or both of them is to exist in the vicinity of the surface of the aluminum foil. Since the adhesiveness between solder and the portion where Sn, Bi or both of them exists is more excellent than the adhesiveness between solder and the portion where Sn and Bi do not exist (that is, conventional aluminum foil), the adhesiveness between solder and the aluminum foil is improved as a result. It is considered that such an improvement in adhesiveness is associated with the facts that: Sn is a component of ordinary lead-containing solder; and Sn and Bi are components of lead-free solder.

In the aluminum foil according to the present embodiment, it is preferable that the above-described ratio of the total mass is 0.01 mass % or more and 10 mass % or less.

In the case where the aluminum foil contains Sn but does not contain Bi, the above-described total mass corresponds to the mass of Sn contained in the aluminum foil. In the case where the aluminum foil does not contain Sn but contains Bi, the above-described total mass corresponds to the mass of Bi contained in the aluminum foil. The same applies to the total surface area and the total volume, which will be described later.

In the aluminum foil according to the present embodiment, it is preferable that the ratio of the total surface area of Sn and Bi to the total surface area of the aluminum foil is 0.01% or more and 65% or less, and that this ratio of the total surface area is 5 times or more the ratio of the total volume of Sn and Bi to the volume of Al. In the case where the above-described ratio of the total surface area is less than 0.01%, the adhesiveness to solder tends to be relatively low. In the case where the above-described ratio of the total surface area exceeds 65%, Sn and Bi tend to be more likely to fall off from the soldered aluminum foil. Furthermore, in the case where the above-described ratio of the total surface area is less than 5 times the above-described ratio of the total volume, the adhesiveness to solder tends to be relatively low.

The "ratio of the total surface area of Sn and Bi to the total surface area of the aluminum foil" used herein means the ratio of the total surface area corresponding to the sum of areas of Sn and Bi occupied in the area of the image obtained by observing the aluminum foil by visual observation or using an optical microscope. Specifically, when the aluminum foil is observed using an optical microscope, a two-dimensional area extending in the length and width directions is seen in a visually-observed image. Assuming that this two-dimensional area is the surface of the aluminum foil, the ratio of the total surface area of Sn and Bi occupied in the area of this surface corresponds to the ratio of the total surface area of Sn and Bi to the total surface area of the aluminum foil. This ratio of the total surface area can be calculated by imaging the aluminum foil using a scanning electron microscope (SEM) up to such a depth as can be observed by visual observation or by an optical microscope, and conducting binarization processing based on the contrast of the obtained image.

Furthermore, the "ratio of the total volume of Sn and Bi to the volume of Al" in the aluminum foil is defined as described below. In the case where aluminum foil contains Sn but does not contain Bi, the above-described ratio of the total volume is represented by a numerical value obtained by multiplying the ratio of the mass of Sn to the mass of Al contained in the aluminum foil (Sn/Al×100) (%) by the specific gravity of Al (2.7) and dividing the result by the specific gravity of Sn (7.3). In the case where aluminum foil does not contain Sn but contains Bi, the above-described ratio of the total volume is represented by a numerical value obtained by multiplying the ratio of the mass of Bi to the mass of Al contained in the aluminum foil (Bi/Al×100) (%) by the specific gravity of Al and dividing the result by the specific gravity of Bi (9.8). In the case where the aluminum foil contains Sn and Bi, the above-described ratio of the total volume is represented by a numerical value obtained by multiplying the ratio of the total mass of Sn and Bi to the mass of Al contained in the aluminum foil {(Sn+Bi)/Al× 100}(%) by the specific gravity of Al and dividing the result by the specific gravity of the mixture of Sn and Bi (that changes between 7.3 and 9.8 in accordance with the mixing ratio between Sn and Bi).

Furthermore, the expression that "the ratio of the total surface area of Sn and Bi to the total surface area of the aluminum foil is 5 times or more the ratio of the total volume of Sn and Bi to the volume of Al" means that the numerical value obtained by dividing the "ratio of the total surface area" by the "ratio of the total volume" (surface area/volume) is 5 times or more.

In the aluminum foil according to the present embodiment, it is preferable that the above-described ratio of the total surface area is 0.1 mass % or more and 63.5 mass % or less. Furthermore, the numerical value obtained by dividing the above-described ratio of the total surface area by the above-described ratio of the total volume is preferably 30 times or less, and more preferably 10 times or more and 20 times or less.

It is preferable that the aluminum foil according to the present embodiment is tempered such that its temper designation is set in a range from O to 1/4H defined in JIS-H0001. The present inventors confirmed that the adhesiveness to solder is sufficiently high when the aluminum foil is tempered as described above.

In this case, symbols such as "1/4H" and "O" (alphabets or a combination of alphabets and numbers) defined in JIS-H0001 each show the tempering degree of the aluminum foil, by which the hardness of the aluminum foil can be recognized. The aluminum foil according to the present embodiment is manufactured by rolling and heat-treating an ingot or a casting plate used as a raw material of aluminum foil. In this case, the tempering degree can be changed by the temperature conditions of this heat treatment, and thereby, the hardness can be adjusted.

The aluminum foil tempered in a "range from O to 1/4H" is intended to include soft aluminum foil tempered to the level of 0, aluminum foil tempered to the level of 1/4H, and aluminum foil tempered to the levels ranging from O to 1/4H. Also, the aluminum foil tempered in a "range from 3/4H to H" is intended to include aluminum foil tempered to the level of 3/4H, hard aluminum foil tempered to the level of H, and aluminum foil tempered to the levels ranging from 3/4H to H.

Since the aluminum foil according to the present embodiment is highly adhesive to solder, it can be suitably used for soldering. Particularly, when the thickness of the aluminum foil is 3 µm or more and 200 µm or less, this aluminum foil can be suitably used for soldering to precision electronic components and the like. Examples of a specific method of utilizing aluminum foil may be a method of utilizing aluminum foil as an electron device, a component for a semiconductor device, a wiring line, and the like. The thickness of the aluminum foil according to the present embodiment is more preferably 30 µm or more and 200 µm or less, and furthermore preferably 30 µm or more and 100 µm or less for the purpose of achieving higher adhesiveness.

Method of Manufacturing Aluminum Foil

The method of manufacturing aluminum foil according to the present embodiment includes the steps of: preparing aluminum molten metal (aluminum molten metal preparing step); adding at least one of Sn and Bi to the aluminum molten metal, thereby producing a molten metal mixture in which the ratio of the total mass of Sn and Bi is 0.0075 mass % or more and 15 mass % or less (molten metal mixture producing step); forming an ingot or a casting plate using the molten metal mixture (casting step); rolling the ingot or the casting plate, thereby manufacturing aluminum foil in which the ratio of the total mass of Sn and Bi is 0.0075 mass % or more and 15 mass % or less, the aluminum foil being tempered in a range from 3/4H to H defined in JIS-H0001; and heat-treating this tempered aluminum foil (heat treatment step). Each of the steps will be hereinafter sequentially described.

(Aluminum Molten Metal Preparing Step)

First, aluminum molten metal is prepared. Aluminum molten metal is made of a melt of pure aluminum or an aluminum alloy as described above.

(Molten Metal Mixture Preparing Step)

Then, at least one of Sn and Bi is added to the aluminum molten metal, thereby producing a molten metal mixture in which the ratio of the total mass of Sn and Bi is 0.0075 mass % or more and 15 mass % or less. In the aluminum molten metal, specifically, powder, a mass or a mother alloy of Sn, Bi or both of them is introduced into the aluminum molten metal such that the ratio of the total mass of Sn and Bi to the sum of the mass of the aluminum molten metal and the total mass of Sn and Bi is 0.0075 mass % or more and 15 mass % or less. Then, Sn, Bi or both of them is melted in the aluminum molten metal. In this case, it is preferable that this molten aluminum molten metal is stirred. In addition, this molten metal mixture preparing step can also be performed simultaneously with the aluminum molten metal preparing step described above.

(Casting Step)

Then, an ingot or a casting plate is formed using the molten metal mixture. Specifically, the molten metal mixture is poured into a cast, which is then cooled, thereby manufacturing an ingot formed as a mass of a rectangular parallelepiped. Alternatively, the molten metal mixture is rapidly cooled, for example, by a method of causing the molten metal mixture to flow through between two cooling rolls, thereby manufacturing a casting plate. The molten metal mixture is subjected to a degassing process, a filtering process and the like before forming an ingot or a casting plate, so that a homogeneous ingot or casting plate can be formed.

(Rolling Step)

Then, the ingot or the casting plate is rolled, thereby manufacturing aluminum foil in which the ratio of the total mass of Sn and Bi is 0.0075 mass % or more and 15 mass % or less, and this aluminum foil is tempered in a range from 3/4H to H defined in JIS-H0001. Specifically, the surface of the ingot obtained through the above-described steps is cut and removed, and the ingot from which the surface is removed is rolled, or the casting plate obtained through the above-described steps is rolled, thereby manufacturing aluminum foil tempered in a range from 3/4H to H defined in JIS-H0001 as described above.

(Heat Treatment Step)

Then, the tempered aluminum foil obtained through the above-described steps is subjected to a heat treatment at a temperature of 230° C. or more, thereby manufacturing aluminum foil tempered in a range from O to 1/4H. Specifically, the tempered aluminum foil is first placed in a furnace, and the temperature in the furnace is raised from the room temperature (25° C.) to a target temperature of 230° C. or more. Although this temperature rising rate is not particularly limited, it is preferable that the temperature is raised to a target temperature gradually over time for about 1 hour to 24 hours. After the temperature is raised, the target temperature is maintained for 10 minutes to 168 hours. Then, the temperature in the furnace is lowered to a room temperature (25° C.) by natural cooling. It is to be noted that the temperature in the furnace having the tempered aluminum foil placed therein does not necessarily have to be lowered to a room temperature, but the aluminum foil may be removed from inside the furnace immediately after the target temperature is maintained for a prescribed time period.

By the above-described heat treatment, the aluminum foil tempered in a range from 3/4H to H defined in JIS-H0001 is tempered, so that its hardness is set in a range from O to 1/4H, with the result that aluminum foil of the present invention is obtained.

In the case where the heat treatment temperature is less than 230° C. in the above-described heat treatment, the obtained aluminum foil is lower in adhesiveness to solder than the aluminum foil obtained after the heat treatment as described above. Although the reason of this is unclear, the present inventors presume it as described below.

Upon conducting various studies, the present inventors have confirmed that, when the heat treatment temperature is less than 230° C., less segregation of Sn, Bi or both of them occurs on the surface of the heat-treated aluminum foil; the ratio of the total surface area of Sn and Bi to the total surface area of the heat-treated aluminum foil is less likely to be 0.01% or more and 65% or less; and this ratio of the total surface area is less likely to be 5 times or more the above-described ratio of the total volume. Based on the above, it is presumed that the above-described ratio of the total surface area in the surface area of the aluminum foil, the distribution conditions of Sn, Bi or both of them in the surface, and the like are associated with the adhesiveness of the aluminum foil to solder and changed by the heat treatment temperature. The heat treatment temperature higher than 500° C. is not recommended since such a temperature may increase capital investment and energy cost.

Examples

Although the present invention will be hereinafter described in greater detail with reference to Examples, the present invention is not limited thereto.

Example 1

Aluminum foil was manufactured as described below. First, aluminum made of JIS-A1N90 material (99.98 mass % or more of purity) was melted to prepare aluminum molten metal (aluminum molten metal preparing step). Then, Sn was introduced into the aluminum molten metal to produce a molten metal mixture containing 10 mass % of Sn (molten metal mixture producing step). Then, this molten metal mixture was used to form an ingot (casting step). Then, after the surface of the ingot was cut and removed, the resultant ingot was cold-rolled at a room temperature (25° C.), to manufacture aluminum foils of 30 μm, 50 μm and 100 μm in thickness (rolling step). Then, each aluminum foil was heat-treated at 400° C. in an air atmosphere. It is to be noted that each aluminum foil was tempered such that its temper designation was set at O.

Examples 2 to 7 and Comparative Examples 1 to 5

In each of Examples 2 to 7 and Comparative Examples 1 and 2, aluminum foils of 30 μm, 50 μm and 100 μm in thickness were manufactured by the same method as that in Example 1 except that the mixing ratio of Sn in the molten metal mixture was changed as shown in Table 1.

In Comparative Example 3, aluminum foils of 30 μm, 50 μm and 100 μm in thickness were manufactured by the same method as that in Example 1 except that Sn was not mixed. Furthermore, in each of Comparative Examples 4 and 5, aluminum foils of 30 μm, 50 μm and 100 μm in thickness were manufactured by the same method as that in Example 1 except that aluminum made of a JIS-A1N30 material (99.3 mass % of purity) was used in Comparative Example 4, an aluminum alloy made of a JIS-A8079 material (98.9 mass % of purity) was used in Comparative Example 5, and Sn was not mixed in Comparative Examples 4 and 5. In addition, the aluminum foil in each of Examples 2 to 7 and Comparative Examples 1 to 5 was tempered such that each temper designation was set at O.

Table 1 shows the type of aluminum as a raw material used in each of Examples 1 to 7 and Comparative Examples 1 to 5, the ratio of Sn content in each aluminum foil, the tempering degree, and the thickness. In addition, the symbol "-" in Table 1 indicates that none is applicable.

Evaluations

A chip resistor was soldered to aluminum foil in each of Examples 1 to 7 and Comparative Examples 1 to 5, to evaluate the adhesiveness between each aluminum foil and the chip resistor.

Specifically, solder paste (trade name: "BI57 LRA-5 AMQ" manufactured by Nihon Superior Co., Ltd.) was prepared. This solder paste was applied on the aluminum foil so as to set the center-to-center distance at 3.5 mm, each diameter at 2 mm and each weight at 1.5 mg, on which a 3216-type chip resistor was placed so as to extend across two points evenly. The resultant product was heated using a near-infrared image furnace ("IR-HP 2-6" manufactured by YONEKURA MFG Co., Ltd.) so as to be soldered. The heating conditions were set such that the nitrogen flow rate was set at 1 L/minute, the highest reached temperature was set at 175° C.±1° C., and the setting time required to raise the temperature from 50° C. to the highest reached temperature was set at 2 minutes and 31 seconds. After heating, the resultant product was naturally cooled until the solder was solidified, in which case the cooling rate was about −13° C./minute.

Then, the shear strength for the chip resistor soldered onto the aluminum foil was measured, to evaluate the adhesiveness between the aluminum foil and the chip resistor joined therewith via solder. For conducting an evaluation, a bond tester (Nordson dage series 4000) was used to measure the shear strength. Specifically, the measurement was made at a tool traveling distance of 0.3 mm/second in the state where the aluminum foil having the chip resistor soldered thereon was fixed to a smooth substrate with a double-faced tape.

The shear strength was measured 3 times for each sample. In the case where the average value was 30N or more, the result was evaluated as "A". In the case where the chip resistor, the solder and the aluminum foil did not peel off but the aluminum foil was broken during measurement of the shear strength, the result was evaluated as "B". In the case where the aluminum foil was not broken and the average value of the shear strength was less than 30N, the result was evaluated as "C". In other words, "A" indicates that the adhesiveness is excellent; "B" indicates that the adhesiveness is excellent with strength that is enough to cause the aluminum foil to break; and "C" indicates that the adhesiveness is the lowest. The results thereof are shown in Table 1.

Furthermore, the ratio (%) of Sn occupied in the surface area of the aluminum foil in each of Examples 1 to 7 and Comparative Examples 1 to 5 was measured. As to the ratio of Sn occupied in the surface area, the surface of the aluminum foil was imaged using a scanning electron microscope at a magnification of 100 times, and then, binarization processing was performed based on the contrast of the obtained image. In addition, the thickness (depth) of the aluminum foil observed by a scanning electron microscope was up to such a depth as could be observed by an optical microscope. Then, assuming that a white region or a light grey region was defined as an area occupied by Sn; and a dark grey region or a black region was defined as an area occupied by aluminum, the ratio (%) of Sn occupied in the surface area of the aluminum foil was calculated. It is to be noted that the actual area of the aluminum foil included in the obtained image is 1.28 mm×0.96 mm. The results thereof are shown in Table 1.

TABLE 1

| | Aluminum | Sn Containing Ratio (Mass %) | Tempering | Thickness of Aluminum Foil | | | | | |
|---|---|---|---|---|---|---|---|---|---|
| | | | | 30 μm | | 50 μm | | 100 μm | |
| | | | | Adhesiveness | Sn Area Ratio (%) | Adhesiveness | Sn Area Ratio (%) | Adhesiveness | Sn Area Ratio (%) |
| Example 1 | JIS-A1N90 material | 10 | ○ | B | 50.4 | B | 59.0 | A | 59.7 |
| Example 2 | JIS-A1N90 material | 5 | ○ | B | 33.3 | B | 34.2 | A | 39.6 |
| Example 3 | JIS-A1N90 material | 3 | ○ | B | 25.9 | B | 28.4 | A | 42.1 |
| Example 4 | JIS-A1N90 material | 1 | ○ | B | 8.7 | B | 7.7 | A | 14.1 |
| Example 5 | JIS-A1N90 material | 0.1 | ○ | B | 0.5 | B | 0.7 | A | 0.9 |
| Example 6 | JIS-A1N90 material | 0.015 | ○ | B | 0.1 | B | 0.1 | A | 0.1 |
| Example 7 | JIS-A1N90 material | 0.01 | ○ | B | 0.03 | B | 0.04 | A | 0.05 |
| Comparative Example 1 | JIS-A1N90 material | 20 | ○ | C | 70.4 | C | 74.9 | C | 80.6 |
| Comparative Example 2 | JIS-A1N90 material | 0.005 | ○ | C | <0.01 | C | <0.01 | C | <0.01 |
| Comparative Example 3 | JIS-A1N90 material | — | ○ | C | — | C | — | C | — |
| Comparative Example 4 | JIS-A1N30 material | — | ○ | C | — | C | — | C | — |
| Comparative Example 5 | JIS-A8079 material | — | ○ | C | — | C | — | C | — |

Referring to Table 1, the aluminum foil and the chip resistor were joined via solder with each other with sufficient strength in each of Examples 1 to 7, whereas the chip resistor and the aluminum foil were joined with each other not with sufficient strength in each of Comparative Examples 1 to 5. Furthermore, upon visual observation of the solder soldered onto the aluminum foil, the solder adhered only to the side surface of the chip resistor in each of Comparative Examples 1 to 5, whereas solder spread over and came in close contact with both of the aluminum foil surface and the chip resistor in each of Examples 1 to 7. It was also confirmed that the ratio (%) of Sn occupied in the surface area of the aluminum foil was more than 65% in Comparative Example 1, and less than 0.01% in Comparative Example 2.

Example 8

Aluminum foils of 30 μm, 50 μm and 100 μm in thickness were manufactured by the same method as that in Example 1 except that 1 mass % of Cu was further added to aluminum in the aluminum molten metal preparing step. Thereby, each aluminum foil in Example 8 was manufactured.

Evaluations

A chip resistor was soldered onto the aluminum foil in Example 8 by the same method as that in Example 1, and the shear strength was measured. The results thereof are shown in Table 2. Furthermore, the ratio (%) of Sn occupied in the surface area of the aluminum foil in Example 8 was measured. The results thereof are shown in Table 2.

TABLE 2

| | Sn Containing Ratio (Mass %) | Cu Containing Ratio (Mass %) | Tempering | Thickness of Aluminum Foil | | | | | |
|---|---|---|---|---|---|---|---|---|---|
| | | | | 30 μm | | 50 μm | | 100 μm | |
| | | | | Adhesiveness | Sn Area Ratio (%) | Adhesiveness | Sn Area Ratio (%) | Adhesiveness | Sn Area Ratio (%) |
| Example 8 | 10 | 1 | ○ | B | 36.0 | B | 50.1 | A | 63.5 |

Referring to Table 2, in Example 8, aluminum foil and a chip resistor were joined via solder with each other with sufficient strength. Furthermore, upon visual observation of the solder soldered onto the aluminum foil, solder spread over and came in close contact with both of the aluminum foil surface and the chip resistor in Example 8.

Example 9

Aluminum foils of 30 μm, 50 μm and 100 μm in thickness were manufactured by the same method as that in Example 2 except that 5 mass % of Bi in place of Sn was added to aluminum in the molten metal mixture producing step. Thereby, each aluminum foil in Example 9 was manufactured.

Evaluations

A chip resistor was soldered onto the aluminum foil in Example 9 by the same method as that in Example 1, and the shear strength was measured. The results thereof are shown in Table 3. Furthermore, the ratio (%) of Bi occupied in the surface area of the aluminum foil in example 9 was measured. The results thereof are shown in Table 3. In the image that was imaged by a scanning electron microscope, assuming that a white region or a light grey region was defined as an area occupied by Bi, and a dark grey region or a black region was defined as an area occupied by aluminum, the ratio (%) of Bi occupied in the surface area of the aluminum foil was calculated.

TABLE 3

| | | Thickness of Aluminum Foil | | | | | |
|---|---|---|---|---|---|---|---|
| | | 30 μm | | 50 μm | | 100 μm | |
| Bi Containing Ratio (Mass %) | Tempering | Adhesiveness | Bi Area Ratio (%) | Adhesiveness | Bi Area Ratio (%) | Adhesiveness | Bi Area Ratio (%) |
| Example 9 | 5 | ○ | B | 28.6 | B | 28.4 | A | 23.1 |

Referring to Table 3, in Example 9, aluminum foil and a chip resistor were joined with each other via solder with sufficient strength. Furthermore, upon visual observation of the solder soldered onto the aluminum foil, solder spread over and came in close contact with both of the aluminum foil surface and the chip resistor in Example 9.

Examples 10, 11 and Comparative Example 6

Aluminum foils of 30 μm, 50 μm and 100 μm in thickness were manufactured by the same method as that in Example 3 except that the annealing temperature was changed to 250° C. in the heat treatment step. Thereby, each aluminum foil in Example 10 was manufactured. Furthermore, aluminum foils of 30 μm, 50 μm and 100 μm in thickness were manufactured by the same method as that in Example 3 except that the annealing temperature was changed to 300° C. in the heat treatment step. Thereby, each aluminum foil in Example 11 was manufactured. Furthermore, aluminum foils of 30 μm, 50 μm and 100 μm in thickness were manufactured by the same method as that in Example 3 except that the annealing temperature was changed to 200° C. in the heat treatment step. Thereby, each aluminum foil in Comparative Example 6 was manufactured.

Evaluations

A chip resistor was soldered onto the aluminum foil in each of Examples 10 and 11 and Comparative Example 6 by the same method as that in Example 1, and the shear strength was measured. The results thereof are shown in Table 4. Furthermore, as to the aluminum foil in each of Examples 10 and 11 and Comparative Example 6, the ratio (%) of the surface area of Sn occupied in the surface area of each aluminum foil and the ratio (%) of the volume of Sn to the volume of Al were calculated. Then, it was evaluated whether or not the ratio of the surface area of Sn was 5 times or more the ratio (%) of the volume of Sn to the volume of Al. The results thereof are shown in Table 4. In the case where the ratio of the surface area of Sn was 5 times or more the ratio (%) of the volume of Sn to the volume of Al, the result was defined as X. In the case where the ratio (%) of the surface area of Sn was less than 5 times the ratio (%) of the volume of Sn to the volume of Al, the result was defined as Y.

TABLE 4

| | | | | Thickness of Aluminum Foil 30 μm | | |
|---|---|---|---|---|---|---|
| | | Heat | | | | |
| | Sn Containing Ratio (Mass %) | Treatment Temperature (° C.) | Tempering | Adhesiveness | Sn Area Ratio (%) | Surface Area/ Volume |
| Example 10 | 3 | 250 | 1/4H | B | 16.4 | X |
| Example 11 | 3 | 300 | ○ | B | 15.7 | X |

TABLE 4-continued

| | | | | Thickness of Aluminum Foil 30 μm | | |
|---|---|---|---|---|---|---|
| | | Heat | | | | |
| | Sn Containing Ratio (Mass %) | Treatment Temperature (° C.) | Tempering | Adhesiveness | Sn Area Ratio (%) | Surface Area/ Volume |
| Comparative Example 6 | 3 | 200 | 1/2H | C | 4.9 | Y |

Referring to Table 4, the aluminum foil and the chip resistor were joined via solder with each other with sufficient strength in each of Examples 10 and 11, whereas the chip resistor and the aluminum foil were joined with each other not with sufficient strength in Comparative Example 6. Furthermore, upon visual observation of the solder soldered onto the aluminum foil, solder adhered only to the side surface of the chip resistor in Comparative Example 6, whereas solder spread over and came in close contact with both of the aluminum foil surface and the chip resistor in each of Examples 1 and 11. Furthermore, when comparing the ratio (%) of the surface area of Sn occupied in the surface area of the aluminum foil and the ratio (%) of the volume of Sn occupied in the volume of Al of the aluminum foil, it was confirmed in Comparative Example 6 that the ratio (%) of the surface area of Sn was less than 5 times the ratio (%) of the volume of Sn occupied in the volume of Al.

Example 12

Aluminum foil having a thickness of 30 μm in Example 6 was bonded to a polyimide film having a thickness of 35 μm by an adhesive. Further, a resist pattern was printed on the surface of the aluminum foil. The resist pattern was formed to have a line width of 1 mm and a distance between lines of 2 mm. The product obtained by bonding the printed aluminum foil and the polyimide film to each other was immersed in an acid-based etching solution. Then, aluminum foil with no resist printed thereon was removed by etching, and the resultant product was rinsed and dried, thereby manufacturing an aluminum foil structure body in Example 12.

Evaluations

First, 1.5 mg of solder paste described above was applied onto each of two aluminum lines remained after etching in the aluminum foil structure body in Example 12, and the above-described chip resistor was placed thereon. The chip resistor was further soldered by the same method as that in Example 1, and the shear strength was measured. The results thereof are shown in Table 5.

TABLE 5

| | | | | | Thickness of Aluminum Foil 30 μm | |
|---|---|---|---|---|---|---|
| | Heat | | | | | |
| | Sn Containing Ratio (Mass %) | Treatment Temperature (° C.) | Tempering | Etching Process | Adhesiveness | Sn Area Ratio (%) |
| Example 12 | 0.015 | 400 | ◯ | Done | A | 0.1 |

Referring to Table 5, in Example 12, an aluminum foil structure body and a chip resistor were joined with each other via solder with sufficient strength. Furthermore, upon visual observation of the solder soldered onto the aluminum foil structure body, solder spread over and came in close contact with both of the aluminum foil surface and the chip resistor in Example 12.

Although the embodiments and examples of the present invention have been described as above, the configurations of the embodiments and examples described above are intended to be combined as appropriate from the beginning.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

The invention claimed is:

1. Aluminum foil consisting of pure aluminum and at least one of Sn and Bi,
a ratio of a total mass of Sn and Bi to a total mass of the aluminum foil being 0.0075 mass % or more and 15 mass % or less; a ratio of a total surface area of Sn and Bi to a total surface area of the aluminum foil is 0.01% or more and 65% or less, and the ratio of the total surface area is 5 times or more a ratio of a total volume of Sn and Bi to a volume of Al.

2. The aluminum foil according to claim 1, wherein the aluminum foil is tempered in a range from O to 1/4H as defined in JIS-H0001.

3. The aluminum foil according to claim 1, wherein the aluminum foil is aluminum foil for soldering.

4. An electronic component wiring board manufactured using the aluminum foil according to claim 1.

5. A method of manufacturing the aluminum foil according to claim 1, wherein the method comprises the steps of:
preparing aluminum molten metal;
adding at least one of Sn and Bi to the aluminum molten metal to produce a molten metal mixture in which a ratio of a total mass of Sn and Bi is 0.0075 mass % or more and 15 mass % or less;
forming an ingot or a casting plate using the molten metal mixture;
rolling the ingot or the casting plate to manufacture aluminum foil in which the ratio of the total mass of Sn and Bi is 0.0075 mass % or more and 15 mass % or less, the aluminum foil being tempered in a range from 3/4H to H as defined in JIS-H0001; and
subjecting the aluminum foil to a heat treatment at a temperature of 230° C. or more so as to be tempered.

* * * * *